United States Patent
Ueda

[11] Patent Number: 6,147,532
[45] Date of Patent: Nov. 14, 2000

[54] PLL CIRCUIT CAPABLE OF PREVENTING MALFUNCTION OF FF CIRCUITS CONNECTED THERETO AND SEMICONDUCTOR INTEGRATED CIRCUIT INCLUDING THE PLL CIRCUIT

[75] Inventor: Masahiro Ueda, Tokyo, Japan

[73] Assignee: Mitsubishi Denki Kabushiki Kaisha, Tokyo, Japan

[21] Appl. No.: 09/231,784

[22] Filed: Jan. 15, 1999

[30] Foreign Application Priority Data

Aug. 7, 1998 [JP] Japan .................................. 10-224788

[51] Int. Cl.⁷ ..................................................... H03L 7/06
[52] U.S. Cl. .......................... 327/158; 327/149; 327/237; 327/175; 327/172
[58] Field of Search ..................................... 327/147, 149, 327/153, 156, 158, 161, 244, 270, 237, 175, 172

[56] References Cited

U.S. PATENT DOCUMENTS 5,087,829  2/1992  Ishibashi et al. ....................... 327/270

FOREIGN PATENT DOCUMENTS 9-246920  9/1997  Japan .

Primary Examiner—Dinh T. Le
Attorney, Agent, or Firm—Burns, Doane, Swecker & Mathis, LLP

[57] ABSTRACT

A PLL circuit including a delay circuit which delays an output of one of inverters constituting a VCO by an amount designated externally via a delay control circuit. An operational circuit carries out logical operation between the output of the delay circuit and an output of the final stage inverter of the inverters, and outputs a second clock signal whose duty differs from that of a first clock signal output from a buffer circuit. The two clock signals are supplied to flip-flop circuits of different circuit blocks so as to prevent malfunction of these flip-flop circuits.

12 Claims, 15 Drawing Sheets

TRUTH TABLE

| S0 | S1 | Y0 | Y1 | Y2 | Y3 |
|----|----|----|----|----|----|
| L  | L  | L  | L  | L  | H  |
| H  | L  | L  | L  | H  | L  |
| L  | H  | L  | H  | L  | L  |
| H  | H  | H  | L  | L  | L  |

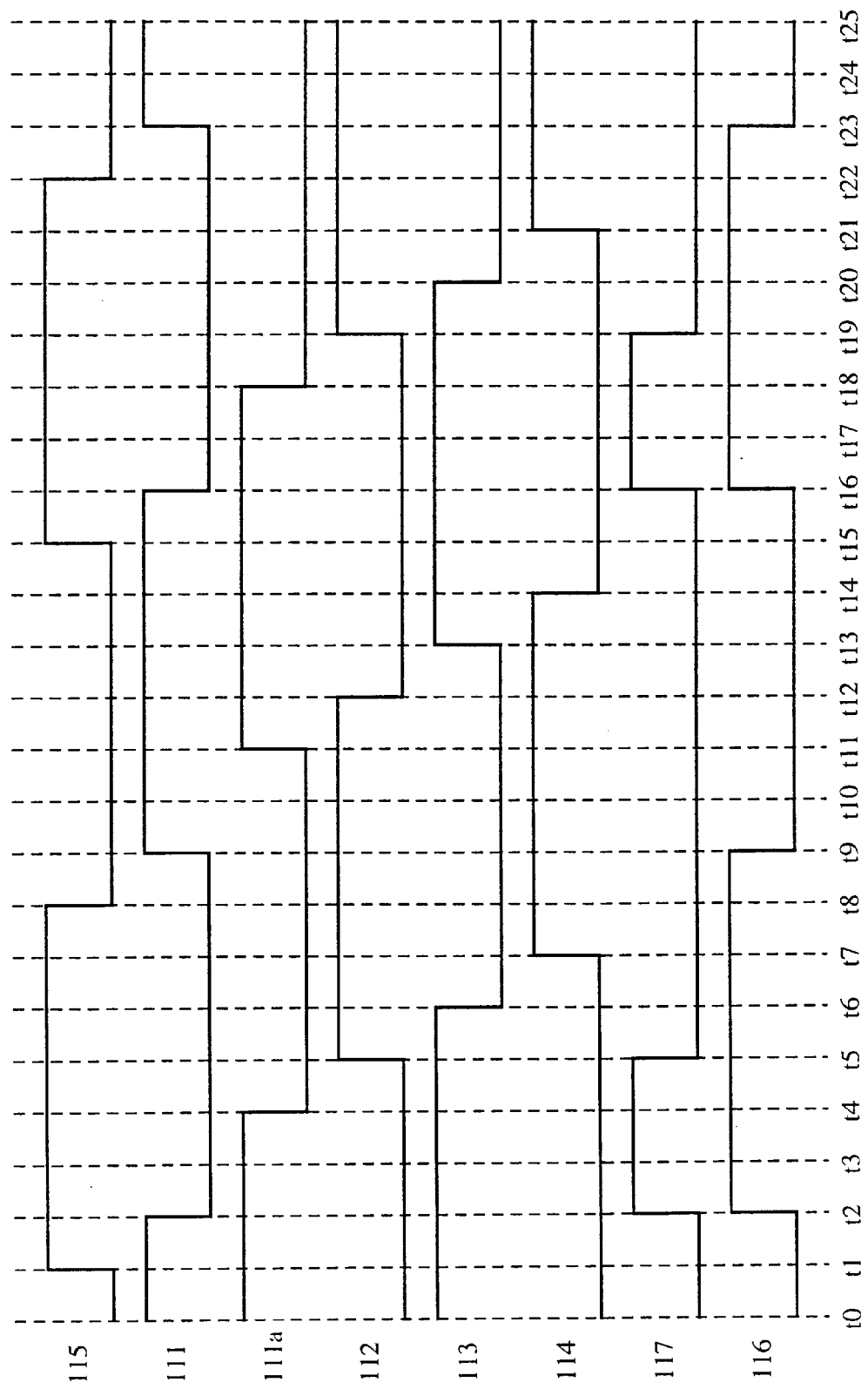

PLL CIRCUIT CAPABLE OF PREVENTING MALFUNCTION OF FF CIRCUITS CONNECTED THERETO AND SEMICONDUCTOR INTEGRATED CIRCUIT INCLUDING THE PLL CIRCUIT

BACKGROUND OF THE INVENTION

1. Field of the Invention

The present invention relates to a PLL (Phase Locked Loop) circuit that outputs a variable duty and/or variable frequency clock signal, and to a semiconductor integrated circuit including the PLL circuit.

2. Description of Related Art

FIG. 13 is a block diagram showing a configuration of an LSI (Large Scale Integration) including a conventional PLL circuit. In FIG. 13, the reference numeral 1 designates a phase comparator that compares the phase of a reference clock signal CLK with an internal clock signal of the LSI, and outputs pulses with a width corresponding to the phase difference; and 2 designates a charge pump circuit for converting to a voltage the pulses supplied from the phase comparator 1.

The reference numeral 3 designates a VCO (Voltage Controlled Oscillator) that generates a clock signal with a frequency corresponding to the voltage supplied from the charge pump circuit 2; 4 designates an output driver circuit for supplying internal components of the LSI with a clock signal 116 fed from the VCO 3; and 5 designates a circuit block consisting of flip-flop circuits 6. The output driver circuit 4, receiving the clock signal 116 from the VCO 3, reduces the output impedance to increase its current drive capacity for driving the load consisting of the flip-flop circuits 6. The reference numeral 7 designates a PLL circuit comprising the phase comparator 1, charge pump circuit 2, VCO 3 and output driver circuit 4.

Next, the operation of the conventional LSI will be described.

The phase comparator 1 receives at an input terminal R the reference clock signal CLK fed from the outside of the LSI via an input buffer circuit (not shown), and at an input terminal V the internal clock signal 116 fed back from the output driver circuit 4. The phase comparator 1 compares the phases of the two inputs, and outputs pulses with a width corresponding to their phase difference: If the phase of the clock signal 116 lags behind that of the reference clock signal CLK, the pulses are output from an output terminal U; whereas if the phase of the clock signal 116 leads that of the reference clock signal CLK, the pulses are output from an output terminal D.

The charge pump circuit 2, receiving the pulses fed from the output terminal U or D of the phase comparator 1, converts the pulses into a voltage, and outputs it from the output terminal Vout. Receiving the voltage from the charge pump circuit 2 at its input terminal Vin, the VCO 3 outputs from its output terminal Fout the clock signal 116 with an oscillation frequency corresponding to the voltage. Thus, the clock signal 116 comes to resemble the reference clock signal CLK, the PLL circuit 7 locks after repeating such loops, and the clock signal 116 matches the reference clock signal CLK closely.

FIG. 14 is a block diagram showing the structure of the VCO 3 in FIG. 13. In FIG. 14, reference numerals 11, 12, 13, 14 and 15 each designate a CMOS (Complementary Metal Oxide Semiconductor) inverter (INV); 16 designates an input side control circuit for carrying out control in response to the voltage supplied to the input terminal Vin; 17 designates a power supply side control circuit for carrying out control in accordance with a command from the control circuit 16; 18 designates a ground side control circuit for carrying out control in accordance with a command from the control circuit 16; and 19 designates a buffer circuit that receives an output signal 115 of the inverter 15, and outputs the clock signal 116 from the output terminal Fout of the VCO 3.

FIG. 15 is a timing chart illustrating timing relationships between various portions of the VCO 3 in FIG. 14. In FIG. 15, reference numerals 111, 112, 113, 114 and 115 designate output signals of the inverters 11, 12, 13, 14 and 15, respectively, and 116 designates the clock signal output from the buffer circuit 19. For simplicity, the outputs of the inverters 11, 12, 13, 14 and 15 are assumed to have the same period, the same duty of 50% and the same rise and fall delay times.

The inverters 11–15 and the buffer circuit 19 each delay their output by $\Delta t = t(n) - t(n-1)$ with respect to their input, where n is a given time, and the delay time $\Delta t$ of the inverters 11–15 is determined by the ratio (period)/(the number of stages of the inverters).

In FIG. 14, receiving the voltage from the charge pump circuit 2 at its input terminal Vin, the VCO 3 controls the inverters 11–15 with the control circuits 16, 17 and 18 in response to the input voltage Vin, and produces from the inverter 15 the output signal 115. The output signal 115 has the same frequency as the reference clock signal CLK, and its period t1–t11 as illustrated in FIG. 15 is a period at which the PLL circuit 7 locks. The buffer circuit 19 inputs the output signal 115, and outputs the clock signal 116 from the output terminal Fout.

Thus, the conventional PLL circuit 7 fabricated by CMOS LSI technology comprises the VCO 3 including a ring oscillator consisting of multiple CMOS inverters connected in cascade. The multiple stage oscillator offers an advantage of being able to set the duty at 50% because the rising and falling edges of the output waveform are averaged. Conventionally, it is designed such that either the rising edge or the falling edge of the clock signal is used to operate the flip-flop circuits 6 in the LSI. Recently, however, an increasing number of logic circuit designs have come to use both the rising edge and falling edge to achieve high speed operation of the LSI.

With such an arrangement, the conventional PLL circuit 7 has a problem of likely causing the flip-flop circuits 6 to malfunction. The reason for this is that since all the flip-flop circuits 6 are controlled by the single clock signal 116 such that they transfer data at a high speed using both the rising and falling edges, a margin for time reduces between the data input to the flip-flop circuits 6 and the clock signal 116.

As a conventional technique relevant to the present invention, one disclosed in Japanese patent application laid-open No. 9-246920/1997 is known. It comprises, in a PLL circuit that includes a ring oscillator type VCO consisting of CMOS inverters, a selector for selectively outputting one of the outputs of the inverters, and supplies the output of the selector and the VCO output to a NAND circuit and a NOR circuit, respectively, to obtain besides the output signal of the VCO two outputs with different duties. It, however, cannot control the duties from the outside because it generates the outputs with different duties from the outputs of the inverters.

As another conventional technique relevant to the present invention, one disclosed in Japanese patent application laid-open No. 7-307665/1995 is known. It comprises, in a PLL that includes a ring oscillator consisting of CMOS inverters, digital loads that consist of capacitors or the like and are connected to the output portions of the inverters, controls the digital loads by detecting the operation frequency of its VCO to establish the operation frequency in a capture range of the PLL. It, however, cannot generate a plurality of signals with different duties, and the duties are uncontrollable from the outside.

As still another conventional technique relevant to the present invention, one disclosed in Japanese patent application laid-open No. 9-270680/1997 is known. It generates, in a ring oscillator type VCO consisting of a plurality of delay cells, signals which are delayed by every 1/2N of the oscillation period, and supplies them to first inputs of N XOR (Exclusive OR) circuits with their second inputs being supplied with the output of the VCO, thereby obtaining a frequency multiplied output. It, however, cannot output a plurality of signals with different frequencies, and the duty of the frequency multiplied output is uncontrollable from the outside.

As still another conventional technique relevant to the present invention, one disclosed in Japanese patent application laid-open No. 9-292930/1997 is known. It extracts various timing signals from appropriate nodes of inverters connected in cascade in a VCO, and supplies the timing signals to a logic circuit designated from the outside to obtain outputs with various timings and duties. Although it comprises delay circuits connected between nodes, the delay times of the delay circuits are uncontrollable from the outside.

SUMMARY OF THE INVENTION

The present invention is implemented to solve the foregoing problems. It is therefore an object of the present invention to provide a PLL circuit and a semiconductor integrated circuit including the PLL circuit capable of preventing the malfunction of the flip-flop circuits embedded in the LSI by dividing the flip-flop circuits into a plurality of circuit blocks, and by controlling the duty and/or frequency (period) of clock signals supplied to the flip-flop circuits in individual circuit blocks, thereby carrying out optimum control of the setup times for operating the flip-flop circuits.

According to a first aspect of the present invention, there is provided a PLL circuit including a voltage controlled oscillator that includes odd number stages of inverters, the PLL circuit comprising: a first delay circuit connected between two adjacent inverters of the inverters; a first delay control circuit for controlling a delay time of the first delay circuit in response to an external command; a buffer circuit for producing a first clock signal with a period at which the PLL circuit locks; and an operational circuit for carrying out logic operation between a first input and a second input, and for generating a second clock signal, at least one of a duty and a frequency of the second clock signal being different from that of the first clock signal, the first input being at least one signal selected from among an output signal of the first delay circuit and output signals of the inverters, and the second input being an input signal to the buffer circuit.

Here, the first delay circuit may be connected between a first inverter and a second inverter of the inverters, and the operational circuit may carry out logical AND operation between the output signal of the first delay circuit and the input signal to the buffer circuit to generate the second clock signal with its duty different from that of the first clock signal.

The first delay circuit may be connected between a first inverter and a second inverter of the inverters, and the operational circuit may carry out logical OR operation between the output signal of the second inverter and the input signal to the buffer circuit to generate the second clock signal with its duty different from that of the first clock signal.

The first delay circuit may be connected between a first inverter and a second inverter of the inverters, and the operational circuit may carry out logical exclusive OR operation between the output signal of the second inverter and the input signal to the buffer circuit to generate the second clock signal with its frequency different from that of the first clock signal.

The PLL circuit may further comprise: a second delay circuit connected between another two adjacent inverters of the inverters; and a second delay control circuit for controlling a delay time of the second delay circuit in response to an external command, wherein the operational circuit may receive one or more output signals of the inverters, output signals of the first delay circuit and the second delay circuit, and the input signal to the buffer circuit, may carry out logical operations between them, and may generate the second clock signal with its frequency different from that of the first clock signal.

The first delay circuit may be connected between the first inverter and the second inverter, the second delay circuit may be connected between a third inverter and a fourth inverter, wherein the operational circuit may carry out exclusive OR operation between the output signal of the first inverter and the output signal of the first delay circuit, may carry out exclusive OR operation between an output signal of the third inverter and the output of the second delay circuit, may carry out equivalence operation between an output signal of the fourth inverter and the input signal to the buffer circuit, and may carry out logical OR operation of outputs of the exclusive OR operations and an output of the equivalence operation.

According to a second aspect of the present invention, there is provided a semiconductor integrated circuit incorporating a PLL circuit, the semiconductor integrated circuit comprising: a first circuit block including flip flop circuits to which first data is supplied; a second circuit block including flip-flop circuits to which second data is supplied; and a PLL circuit including a voltage controlled oscillator that includes odd number stages of inverters, wherein the PLL circuit comprises: a first delay circuit connected between two adjacent inverters of the inverters; a first delay control circuit for controlling a delay time of the first delay circuit in response to an external command; a buffer circuit for producing a first clock signal with a period at which the PLL circuit locks; and an operational circuit for carrying out logic operation between a first input and a second input, and for generating a second clock signal, at least one of a duty and a frequency of the second clock signal being different from that of the first clock signal, the first input being at least one signal selected from among an output signal of the first delay circuit and output signals of the inverters, and the second input being an input signal to the buffer circuit; a first driver circuit for supplying the flip-flop circuits in the first circuit block with the first clock signal output from the buffer circuit; and a second driver circuit for supplying the flip-flop circuits in the second circuit block with the second clock signal output from the operational circuit.

Here, the PLL circuit may further comprise: a second delay circuit connected between another two adjacent inverters of the inverters; and a second delay control circuit for controlling a delay time of the second delay circuit in response to an external command, wherein the operational circuit may receives one or more output signals of the inverters, output signals of the first delay circuit and the second delay circuit, and the input signal to the buffer circuit, may carry out logical operations between them, and may generate the second clock signal with its frequency different from that of the first clock signal.

BRIEF DESCRIPTION OF THE DRAWINGS

FIG. 6 is a timing chart illustrating outputs of various portions of the VCO in the embodiment 1;

DETAILED DESCRIPTION OF THE PREFERRED EMBODIMENTS

The invention will now be described with reference to the accompanying drawings.
EMBODIMENT 1

Figure 1:
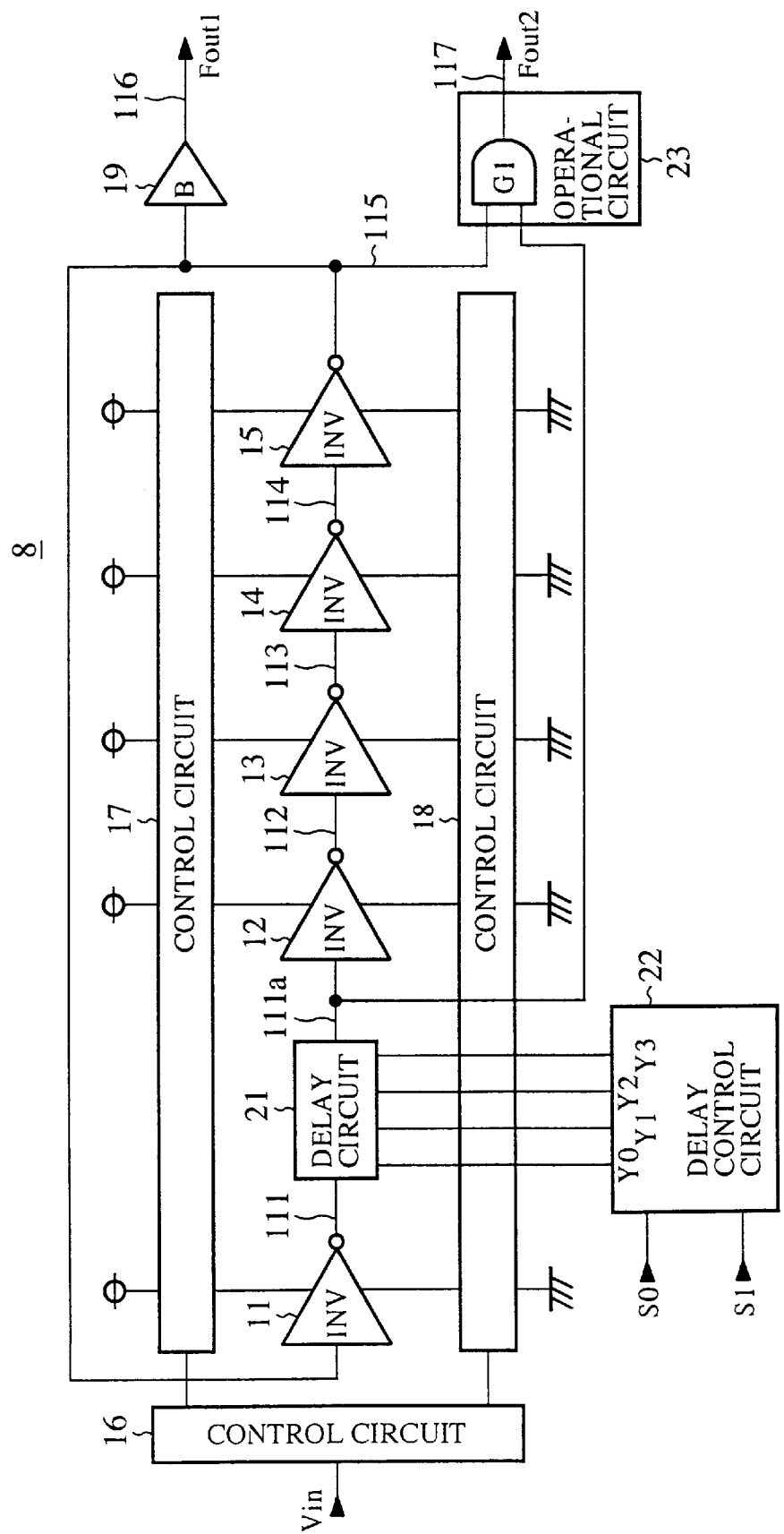
FIG. 1 is a block diagram showing a configuration of a VCO in an embodiment 1 of a PLL circuit in accordance with the present invention.

FIG. 1 is a block diagram showing a configuration of a VCO in an embodiment 1 of a PLL circuit in accordance with the present invention. In FIG. 1, the reference numeral 21 designates a delay circuit with a variable delay time, which is connected across inverters (INV) 11 and 12; 22 designates a delay control circuit for controlling the delay time of the delay circuit 21 in accordance with a command from the outside; and 23 designates an operational circuit that consists of a logic circuit and includes an AND circuit G1. The AND circuit G1 is supplied as its inputs with an output signal 115 from the final stage inverter 15 and an output signal 111a from the delay circuit 21.

Figure 14:
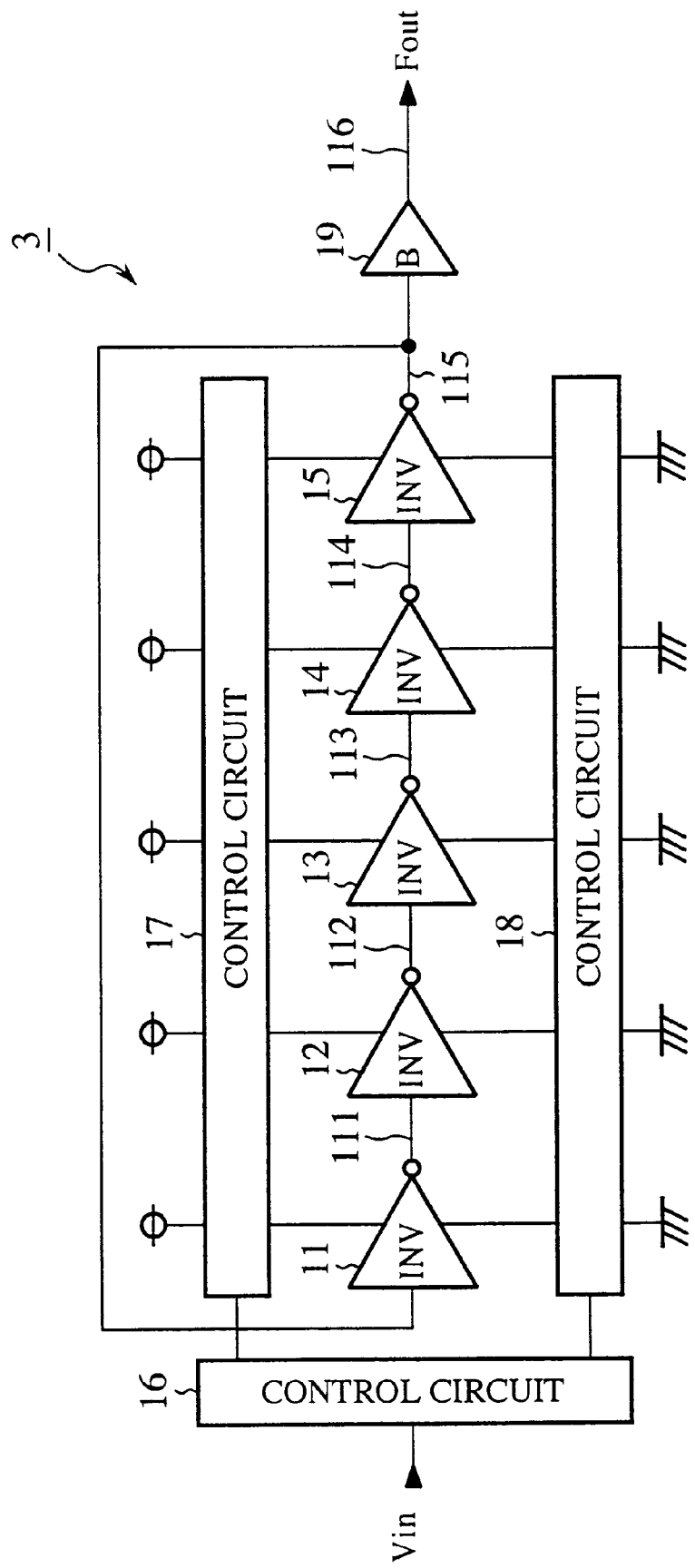
FIG. 14 is a block diagram showing a configuration of a conventional VCO.

The reference numeral 116 designates a first clock signal produced from an output terminal Fout1 of a buffer circuit 19; and 117 designates a second clock signal produced from an output Fout2 of the operational circuit 23. The remaining reference numerals correspond to those of FIG. 14 showing the conventional VCO. Thus, the VCO of the present embodiment 1 outputs, besides the first clock signal 116 similar to that of the conventional VCO, the second clock signal 117 calculated by the operational circuit 23.

Figure 2:
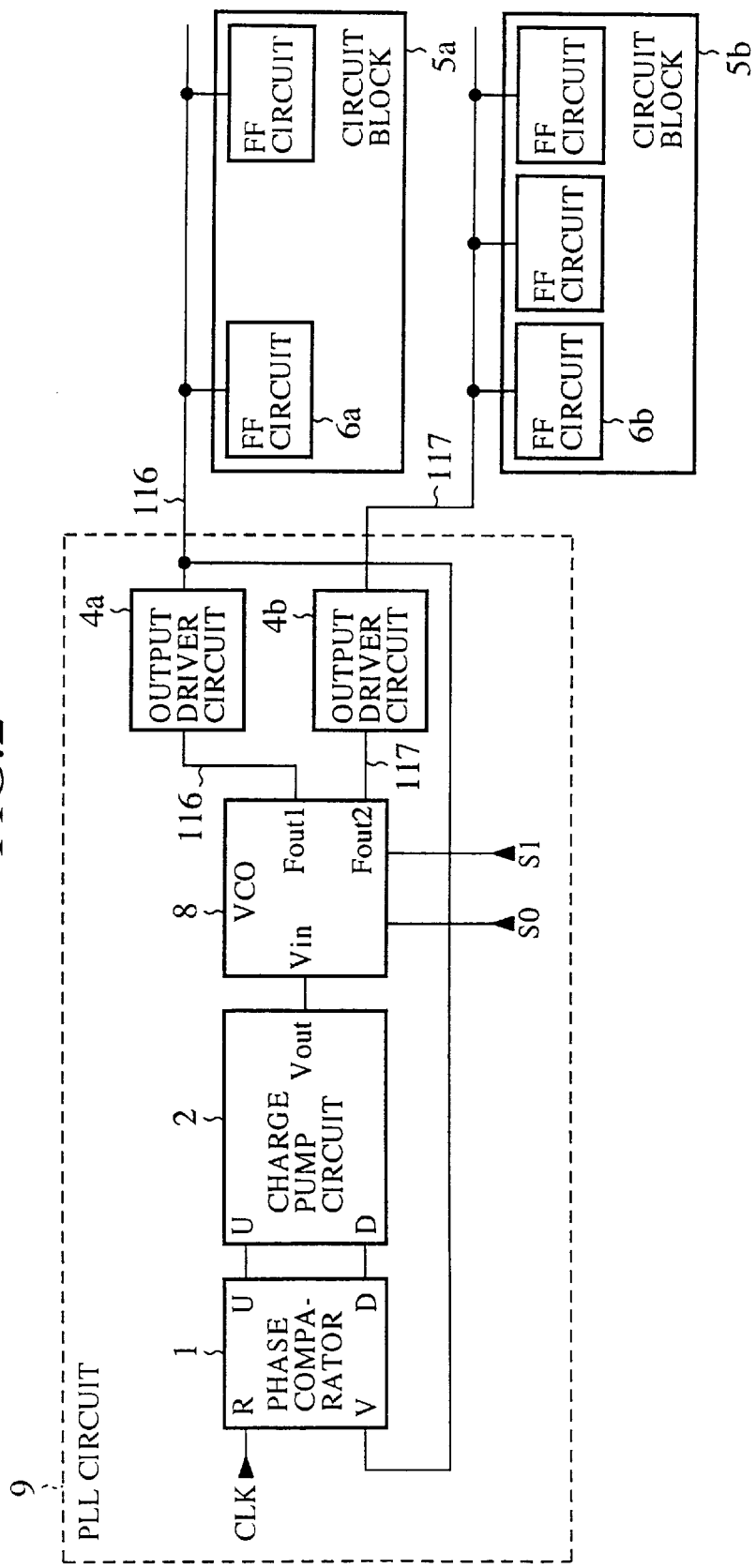
FIG. 2 is a block diagram showing a configuration of a semiconductor integrated circuit incorporating the embodiment 1 of the PLL circuit in accordance with the present invention.

FIG. 2 is a block diagram showing a configuration of a semiconductor integrated circuit incorporating the PLL circuit to which the VCO of FIG. 1 is applied. In FIG. 2, the reference numeral 4a designates an output driver circuit connected to the output terminal Fout1 of the VCO; 4b designates an output driver circuit connected to the output terminal Fout2 of the VCO; 5a designates a circuit block consisting of the flip-flop circuits 6a; 5b designates a circuit block consisting of the flip-flop circuits 6b; 8 designates the VCO as shown in FIG. 1; and 9 designates a PLL circuit comprising the phase comparator 1, charge pump circuit 2, VCO 8, and output driver circuits 4a and 4b.

In FIG. 2, the output driver circuit 4a is a driver for producing the same clock signal as the conventional one, and its output is fed back to the input terminal V of the phase comparator 1. It is assumed here that when operated at the duty of the conventional clock signal, the flip-flop circuits 6a in the circuit block 5a do not bring about any malfunction, but the flip-flop circuits 6b. Thus, the flip-flop circuits 6b in the circuit block 5b are designed to operate at timings different from those of the flip-flop circuits 6a in the circuit block 5a.

The total number of the flip-flop circuit 6a and 6b in the circuit blocks 5a and 5b is equal to or greater than that of the conventional flip-flop circuits 6. Even if only the circuit block 5b is placed in operation, it is necessary for the circuit block 5a to be connected with a small dummy load for stabilizing the operation of the PLL circuit 9.

Figures 3A, 3B:
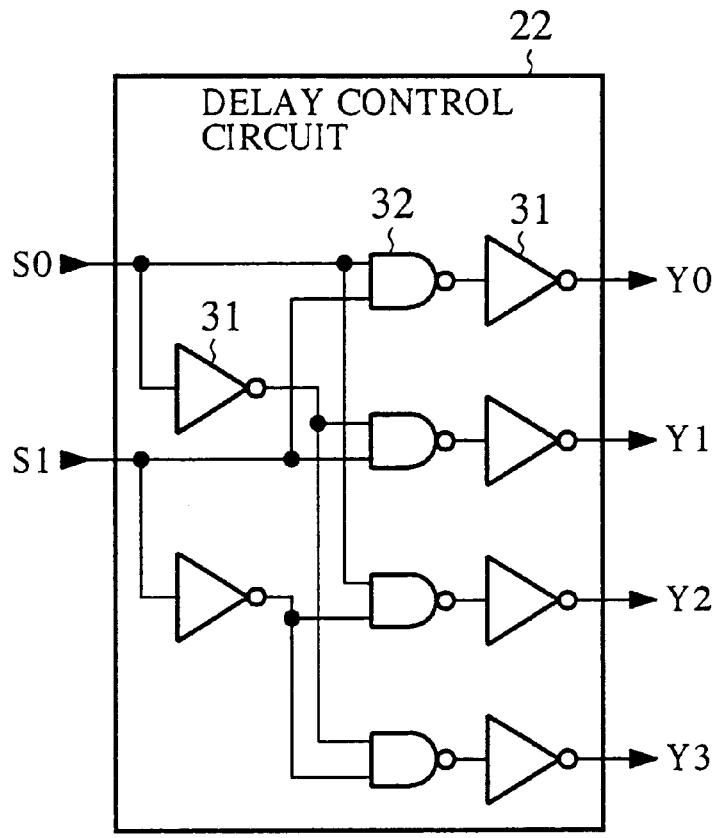
FIGS. 3A and 3B are a circuit diagram showing a delay control circuit in embodiments 1–4 of the PLL circuit in accordance with the present invention, and a truth table of the delay control circuit, respectively.

FIGS. 3A and 3B are a circuit diagram showing the delay control circuit 22, and a truth table of its inputs and outputs. As shown in these figures, the delay control circuit 22 consists of inverters 31 and NAND circuits 32, and produces outputs Y0, Y1, Y2 and Y3 in response to the inputs S0 and S1 from the outside.

Figure 4:
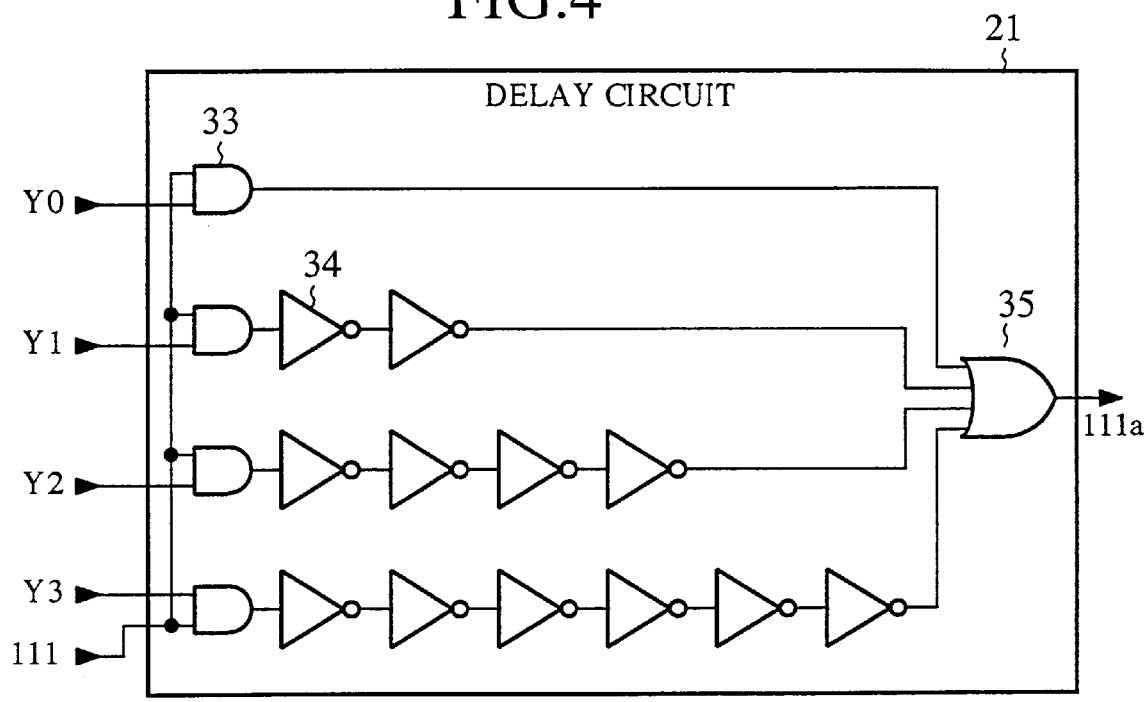
FIG. 4 is a circuit diagram showing an arrangement of a delay circuit in the embodiments 1–4.

FIG. 4 is a circuit diagram showing a configuration of the delay circuit 21. As shown in this figure, the delay circuit 21 consists of AND circuits 33, inverters 34 and an OR circuit 35. It receives the outputs Y0–Y3 of the delay control circuit 22 as shown in FIG. 3A as well as the output signal 111 of the inverter 11. The signal 111 is delayed by an amount selected by one of the signals Y0–Y3, and is output from the OR circuit 35 as the output signal 111a of the delay circuit 21. In FIG. 4, the delay time is lengthened in proportion to the number of AND circuit 33, inverters 34 and OR circuit 35 the input signal 111 passes through.

Figure 5A:
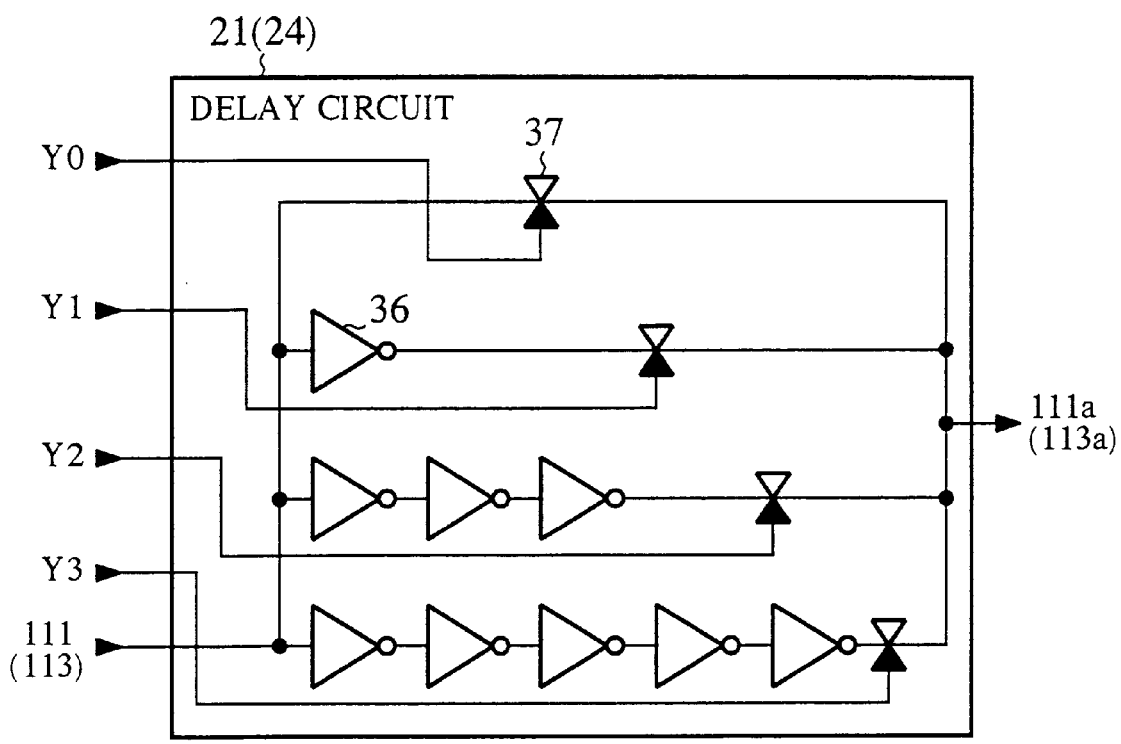
FIGS. 5A and 5B are circuit diagrams showing another arrangement of the delay circuit in the embodiments 1–4.

FIG. 5A is a circuit diagram showing another configuration of the delay circuit 21. As shown in this figure, the delay circuit 21 consists of inverters 36 and transmission gates 37, and receives the output signal 111 from the inverter 11 of FIG. 1 and the outputs Y0–Y3 from the delay control circuit 22 of FIG. 3A. The output signal 111 supplied is delay by an amount selected by one of the signals Y0–Y3, and is output as the output signal 111a. The delay time is lengthened in proportion to the number of inverters 36 and transmission gate 37 the input signal 111 passes through.

Next, the operation of the present embodiment 1 will be described.

Figure 15:
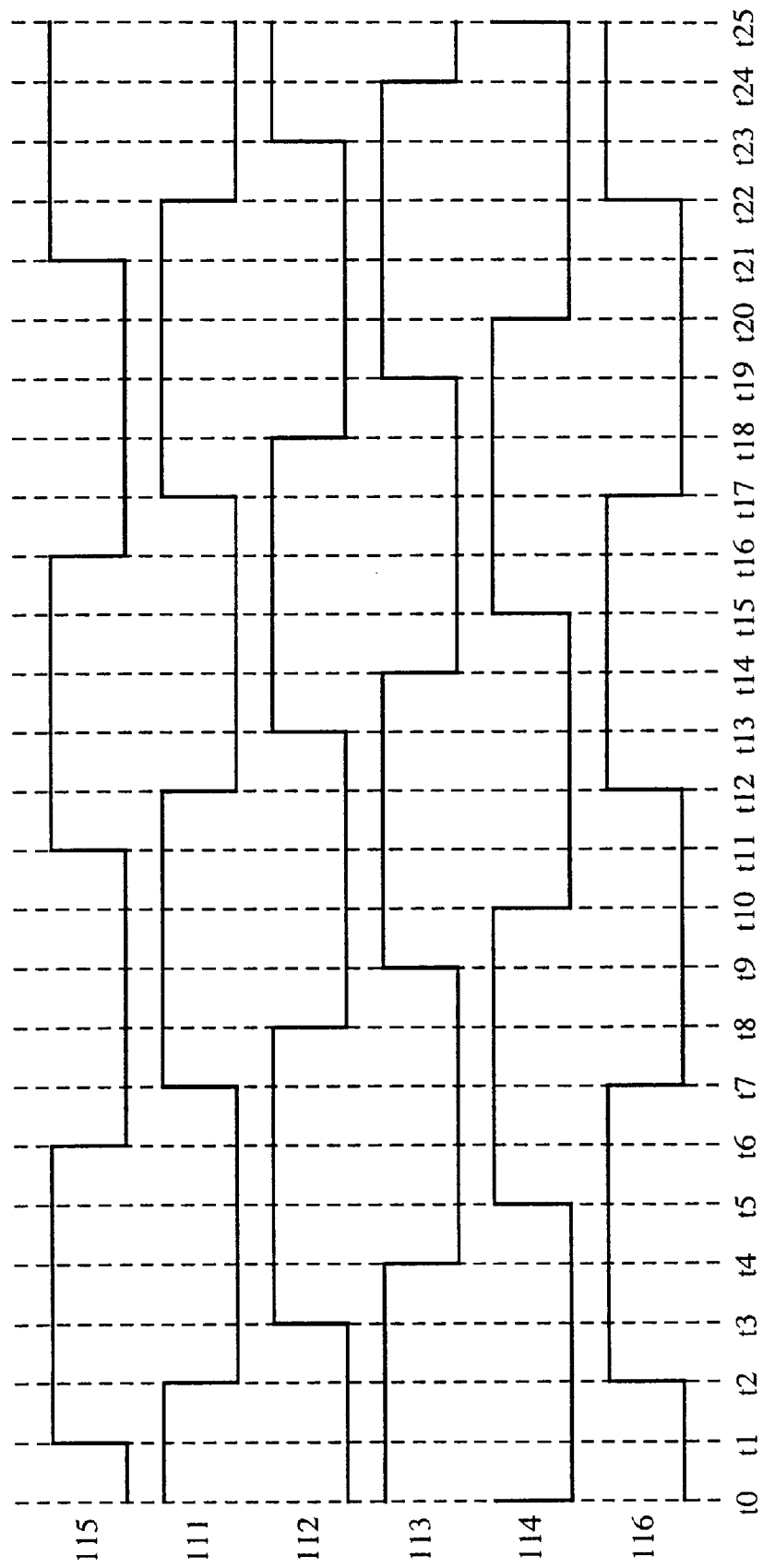
FIG. 15 is a timing chart illustrating outputs of various portions of the conventional VCO.

FIG. 6 is a timing chart illustrating outputs of various portions of the VCO 8 in FIG. 1. In FIG. 6, the rising edge of the output signal 115 of the inverter 15 is fed back to the input terminal V of the phase comparator 1 via the output driver circuit 4a of FIG. 2 at times t1 and t15 that define the period at which the PLL circuit 9 locks. The period t1–t15 is equal to the conventional period t1–t11 as illustrated in FIG. 15, and hence $\Delta t = t(n) - t(n-1)$ is shorter than that of FIG. 15.

In FIG. 1, if "H (high)" signals are supplied to both the input terminals S0 and S1 of the delay control circuit 22 in response to the command from the outside of the LSI, the delay control circuit 22 outputs the "H" signal only from the output Y0 in accordance with the truth table of FIG. 3B. This enables the signal 111 supplied to the delay circuit 21 to pass through one of the AND circuits 33 and the OR circuit 35 shown in FIG. 4, and be produced as the output signal 111a, providing it with a delay of $2\Delta t$ because it passes two elements.

Thus, the output signal 111a of the delay circuit 21 is delayed from the output signal 111 of the inverter 11 by an amount of $2\Delta t = (t4 - t2)$. This will sequentially delay the outputs of the inverters 12–15 by that time $2\Delta t$. Thus, as illustrated in FIG. 6, the buffer circuit 19 outputs the first clock signal 116 with the same frequency and the same phase as those of the conventional one, and the operational circuit 23 outputs the second clock signal 117 by ANDing the output signal 111a of the delay circuit 21 and the output signal 115 of the inverter 15, in which case, the output 117 of the AND circuit G1 is delayed by $\Delta t$ with respect to the inputs.

In this way, although the first clock signal 116 output from the buffer circuit 19 and the second clock signal 117 output from the operational circuit 23 for controlling the PLL circuit 9 have the same frequency, their fall timings differ from each other because their duties are different. As shown in FIG. 2, the first clock signal 116 is supplied to the flip-flop circuit 6a in the circuit block 5a through the output driver circuit 4a, and the second clock signal 117 is supplied to the flip-flop circuit 6b in the circuit block 5b through the output driver circuit 4b. This enables the flip-flop circuit 6a in the circuit block 5a in the LSI to be operated at the same duty as that of the reference clock signal CLK, and the flip-flop circuit 6b in the circuit block 5b to be operated at another duty, for example.

In addition, changing the delay time of the delay circuit 21 via the delay control circuit 22 can vary the duty of the second clock signal 117, and hence the fall timing of that.

When the delay circuit 21 with the arrangement as shown in FIG. 5 is employed, the delay of $2\Delta t$ can be achieved by supplying from the outside of the LSI a "L (low)" signal to the input S0 and the "H" signal to the input S1 of the delay control circuit 22 so that the "H" signal is supplied only to the input Y1 of FIG. 5 as shown in FIG. 3B.

Although the delay circuit 21 is connected between the inverters 11 and 12, it can be connected between any other two adjacent inverters, providing similar effects. That is, this makes it possible to vary the timing of the falling edge of the second clock signal 117 from that of the first clock signal 116 by altering the duty of the second clock signal 117 by varying the delay time.

Furthermore, although the ring oscillator consists of five inverters 11–15 connected in cascade, any number of stages is allowed as long as it is an odd number. Usually, to avoid the effect of harmonics, a prime number is selected as the number of stages.

As described above, the present embodiment 1 has an advantage of being able to prevent the malfunction of the flip-flop circuits 6a and 6b by connecting the delay circuit 21 across the inverters 11 and 12, by controlling the delay time of the delay circuit 21 by the command from the outside via the delay control circuit 22, and by carrying out with the operational circuit 23 the logical AND operation between the outputs of the delay circuit 21 and the inverter 15, so as to generate the second clock signal 117 with different duty than that of the first clock signal 116 output from the buffer circuit 19 for controlling the PLL circuit 9, and to supply, through the output driver circuits 4a and 4b, the flip-flop circuits 6a and 6b in the circuit blocks 5a and 5b with the clock signals whose falling edges have different timings.

In addition, the present embodiment 1 has another advantage of being able to carry out the fine adjustment of the operation timing of the flip-flop circuit 6b even after the LSI is fabricated because the duty of the second clock signal 117 can be adjusted by controlling the delay time of the delay circuit 21 through the delay control circuit 22 in response to the command from the outside of the LSI.

EMBODIMENT 2

Figure 7:
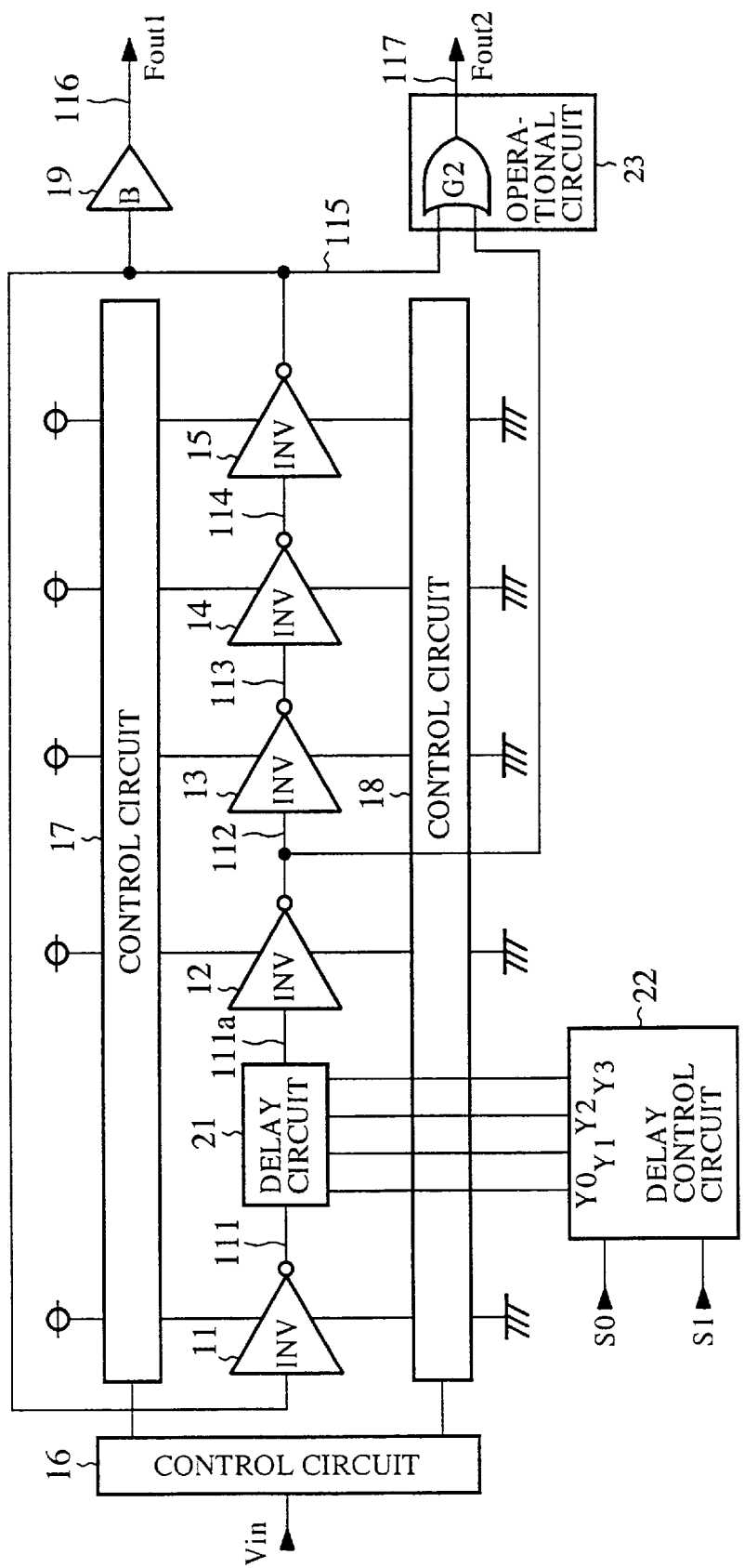
FIG. 7 is a block diagram showing a configuration of a VCO in an embodiment 2 of the PLL circuit in accordance with the present invention.

FIG. 7 is a block diagram showing a configuration of a VCO in the present embodiment 2. In FIG. 7, the reference symbol G2 designates an OR circuit in the operational circuit 23, to which the output signal 112 of the inverter 12 and the output signal 115 of the inverter 15 are supplied. The remaining configuration is the same as that of the embodiment 1 as shown in FIG. 1, and the arrangement of the semiconductor integrated circuit incorporating the PLL circuit, to which the VCO as shown in FIG. 7 is applied, is the same as that of the embodiment 1 as shown in FIG. 2.

Next, the operation of the present embodiment 2 will be described.

Figure 8:
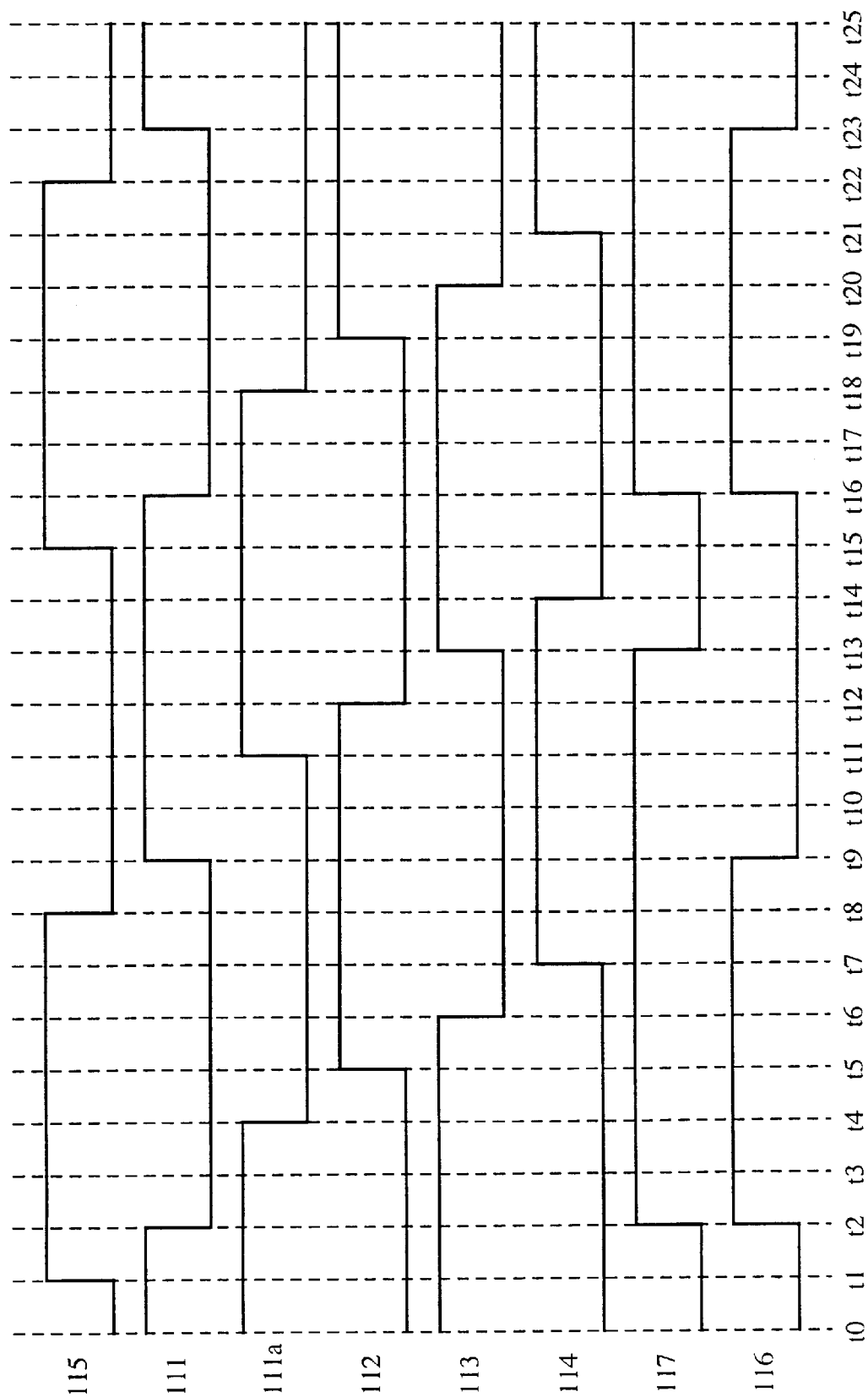
FIG. 8 is a timing chart illustrating outputs of various portions of the VCO in the embodiment 2.

FIG. 8 is a timing chart illustrating outputs of various portions of the VCO 8 in FIG. 7. In FIG. 8, the rising edge of the output signal 115 of the inverter 15 is fed back to the input terminal V of the phase comparator 1 via the output driver circuit 4a of FIG. 2 at times t1 and t15 that define the period at which the PLL circuit 9 locks. The period t1–t15 is equal to the period t1–t15 of the embodiment 1 as illustrated in FIG. 6.

The operational circuit 23 as shown in FIG. 7 outputs the second clock signal 117 as shown in FIG. 8 by ORing the output signal 112 of the inverter 12 and the output signal 115 of the inverter 15, in which case, the output 117 of the OR circuit G2 is delayed by $\Delta t$ with respect to the inputs.

In this way, although the first clock signal 116 output from the buffer circuit 19 and the second clock signal 117 output from the operational circuit 23 have the same frequency, their fall timings differ from each other because their duties are different. As shown in FIG. 2, the first clock signal 116 is supplied to the flip-flop circuit 6a in the circuit block 5a through the output driver circuit 4a, and the second clock signal 117 is supplied to the flip-flop circuit 6b in the circuit block 5b through the output driver circuit 4b. This enables the flip-flop circuit 6a in the circuit block 5a in the LSI to be operated at the same duty as that of the reference clock signal CLK, and the flip-flop circuit 6b in the circuit block 5b to be operated at another duty, for example.

In addition, changing the delay time of the delay circuit 21 via the delay control circuit 22 can vary the duty of the second clock signal 117 as shown in FIG. 8, and hence the fall timing of that.

Although the delay circuit 21 is connected between the inverters 11 and 12, it can be connected between any other two adjacent inverters, providing similar effects. That is, this makes it possible to vary the timing of the falling edge of the second clock signal 117 from that of the first clock signal 116 because the duty of the second clock signal 117 is altered by varying the delay time.

As described above, the present embodiment 2 has an advantage of being able to prevent the malfunction of the flip-flop circuits 6a and 6b by connecting the delay circuit 21 across the inverters 11 and 12, by controlling the delay time of the delay circuit 21 by the command from the outside via the delay control circuit 22, and by carrying out with the operational circuit 23 the logical OR operation between the output signal of the inverter 12 and the output signal 115 of the inverter 15, so as to generate the second clock signal 117 with different duty than that of the first clock signal 116 output from the buffer circuit 19 for controlling the PLL circuit 9, and to supply, through the output driver circuits 4a and 4b, the flip-flop circuits 6a and 6b in the circuit blocks 5a and 5b with the clock signals whose fall timings differ from each other.

In addition, the present embodiment 2 has another advantage of being able to carry out the fine adjustment of the operation timing of the flip-flop circuit 6b even after the LSI is fabricated because the duty of the second clock signal 117 can be adjusted by controlling the delay time of the delay circuit 21 through the delay control circuit 22 in response to the command from the outside of the LSI. EMBODIMENT 3

Figure 9:
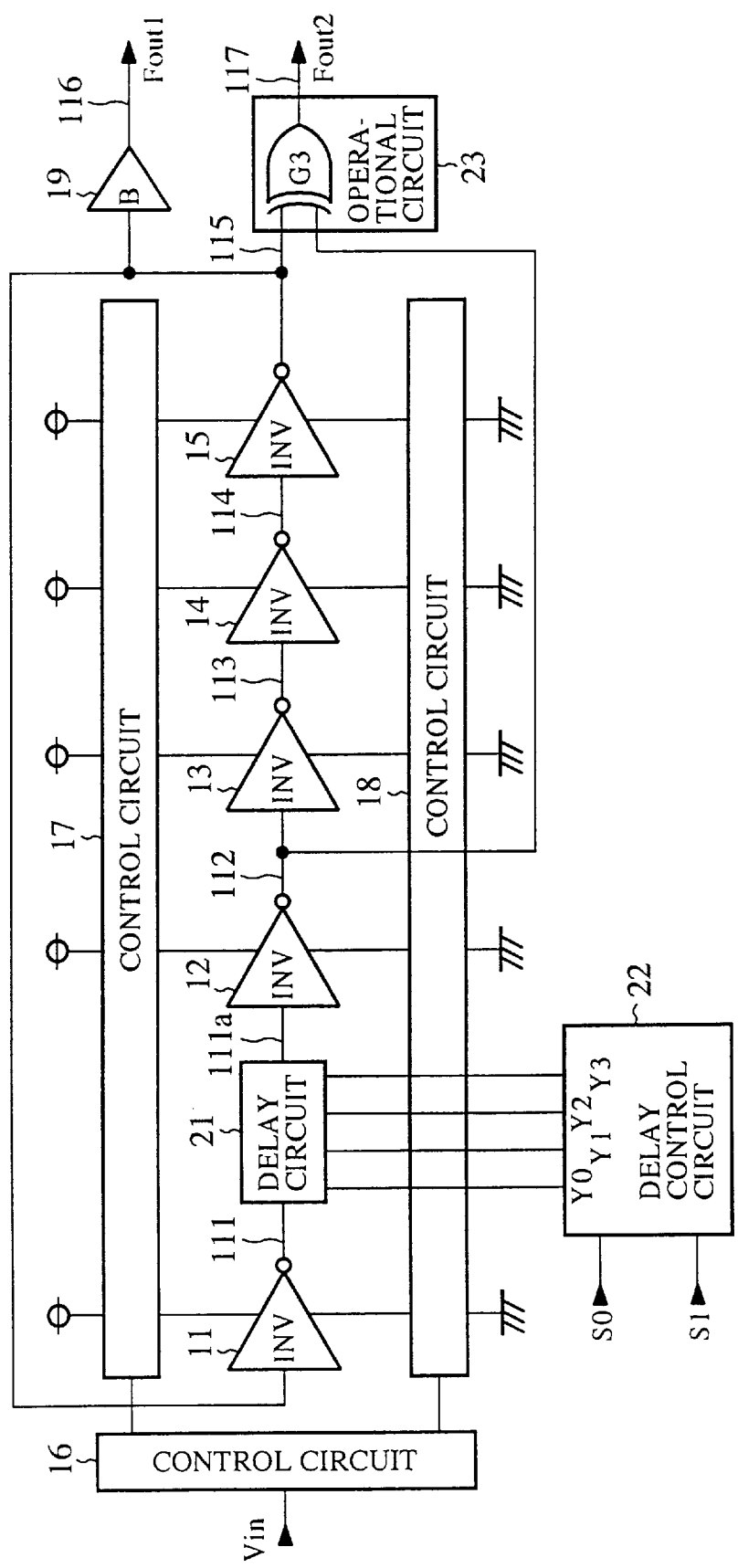
FIG. 9 is a block diagram showing a configuration of a VCO in an embodiment 3 of the PLL circuit in accordance with the present invention.

FIG. 9 is a block diagram showing a configuration of a VCO in the present embodiment 3. In FIG. 9, the reference symbol G3 designates an XOR (exclusive OR) circuit in the operational circuit 23. The remaining configuration is the same as that of the embodiment 2 as shown in FIG. 7, and the arrangement of the semiconductor integrated circuit incorporating the PLL circuit, to which the VCO as shown in FIG. 9 is applied, is the same as that of the embodiment 1 as shown in FIG. 2.

Next, the operation of the present embodiment 3 will be described.

Figure 10:
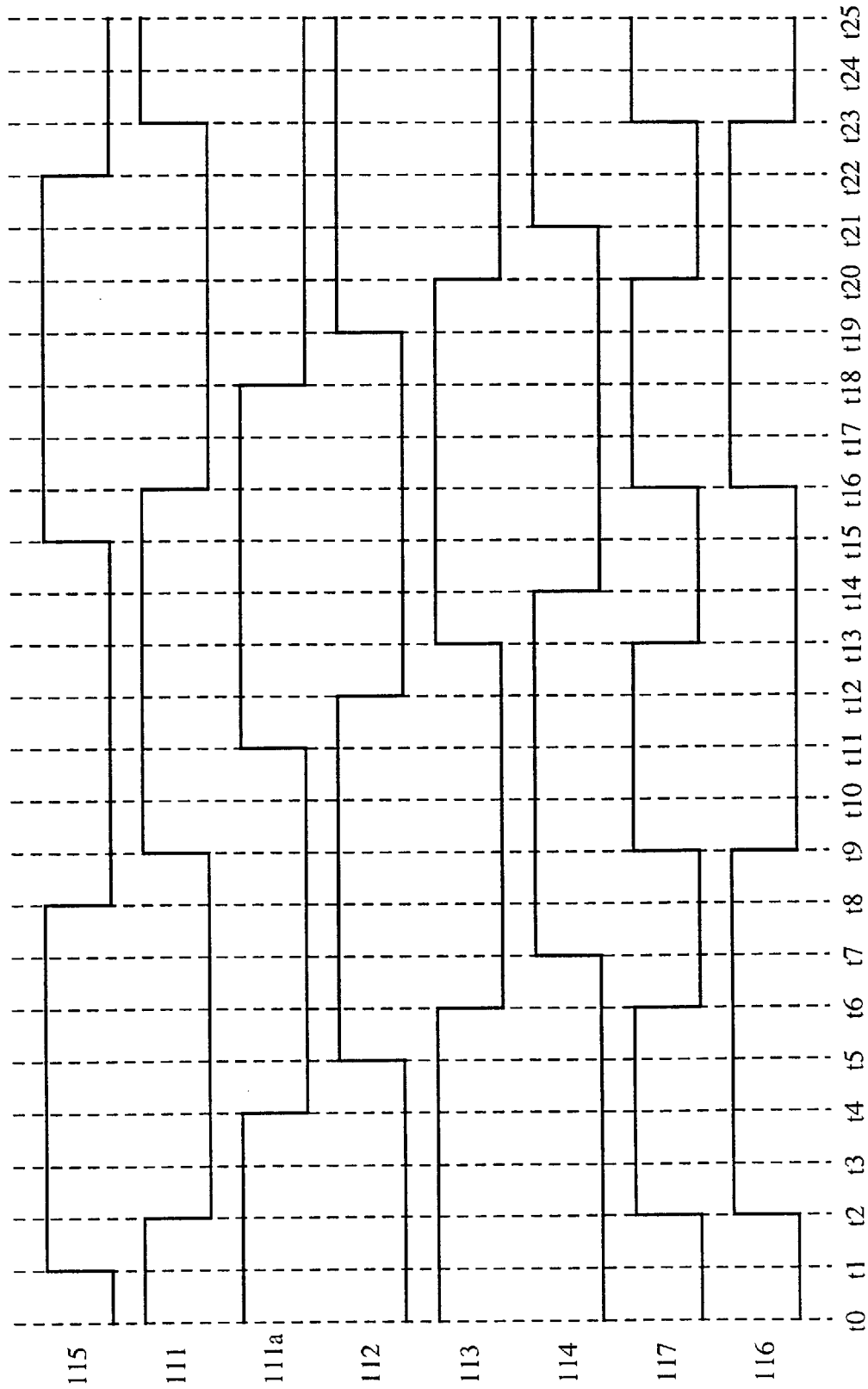
FIG. 10 is a timing chart illustrating outputs of various portions of the VCO in the embodiment 3.

FIG. 10 is a timing chart illustrating outputs of various portions of the VCO 8 in FIG. 9. In FIG. 10, the rising edge of the output signal 115 of the inverter 15 is fed back to the input terminal V of the phase comparator 1 via the output driver circuit 4a of FIG. 2 at times t1 and t15 that define the period at which the PLL circuit 9 locks. The period t1–t15 is equal to the period t1–t15 of the embodiment 1 as illustrated in FIG. 6.

The operational circuit 23 as shown in FIG. 9 outputs the second clock signal 117 as shown in FIG. 10 by carrying out the XOR (exclusive OR) operation between the output signal 112 of the inverter 12 and the output signal 115 of the inverter 15, in which case, the output 117 of the XOR circuit G3 is delayed by Δt with respect to the inputs.

In this way, the second clock signal 117 output from the operational circuit 23 has a double frequency and different rise and fall timings as compared with those of the first clock signal 116 output from the buffer circuit 19. As shown in FIG. 2, the first clock signal 116 is supplied to the flip-flop circuit 6a in the circuit block 5a through the output driver circuit 4a, and the second clock signal 117 is supplied to the flip-flop circuit 6b in the circuit block 5b through the output driver circuit 4b. This enables the flip-flop circuit 6a in the circuit block 5a in the LSI to be operated at the same frequency as that of the reference clock signal CLK, and the flip-flop circuit 6b in the circuit block 5b to be operated at the double frequency, for example.

In addition, changing the delay time of the delay circuit 21 via the delay control circuit 22 can vary the duty of the second clock signal 117 with maintaining its frequency as shown in FIG. 10, thereby being able to alter its fall timing.

Although the delay circuit 21 is connected between the inverters 11 and 12, it can be connected between any other two adjacent inverters, providing similar effects. That is, this makes it possible to assign to the second clock signal 117 double the frequency of the first clock signal 116, and to produce clock signals with different rise and fall timings.

As described above, the present embodiment 3 has an advantage of being able to prevent the malfunction of the flip-flop circuits 6a and 6b by connecting the delay circuit 21 across the inverters 11 and 12, by controlling the delay time of the delay circuit 21 by the command from the outside via the delay control circuit 22, and by carrying out with the operational circuit 23 the XOR operation between the output signal 112 of the inverter 12 and the output signal 115 of the inverter 15, so as to generate the second clock signal 117 with double the frequency of the first clock signal 116 output from the buffer circuit 19 for controlling the PLL circuit 9, and to supply, through the output driver circuits 4a and 4b, the flip-flop circuits 6a and 6b in the circuit blocks 5a and 5b with the clock signals whose rise and fall timings differ from each other.

In addition, the present embodiment 3 has another advantage of being able to carry out the fine adjustment of the operation timing of the flip-flop circuit 6b even after the LSI is fabricated because the duty of the second clock signal 117 can be adjusted by controlling the delay time of the delay circuit 21 through the delay control circuit 22 in response to the command from the outside of the LSI. EMBODIMENT 4

Figure 11:
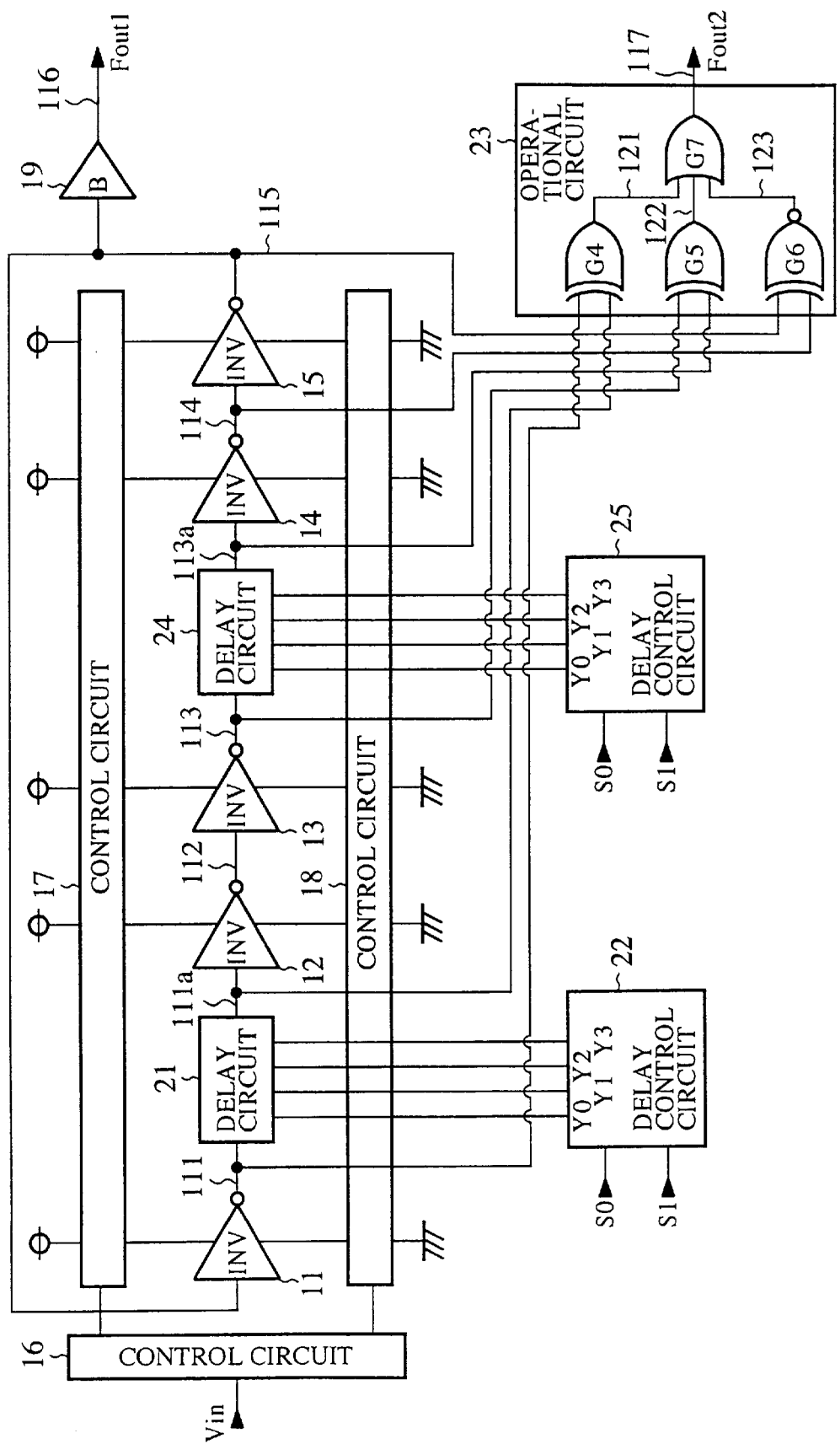
FIG. 11 is a block diagram showing a configuration of a VCO in an embodiment 4 of the PLL circuit in accordance with the present invention.

FIG. 11 is a block diagram showing a configuration of the VCO in the present embodiment 4. In FIG. 11, the reference numeral 24 designates a delay circuit connected between the inverters 13 and 14; and 25 designates a delay control circuit for controlling the delay time of the delay circuit 24. The operational circuit 23 includes XOR (exclusive OR) circuits G4 and G5, a NXOR (not exclusive OR: equivalence) circuit G6 and an OR circuit G7.

The XOR circuit G4 receives at its inputs the output signal 111 of the inverter 11 and the output signal 111a of the delay circuit 21, the XOR circuit G5 receives at its inputs the output signal 113 of the inverter 13 and the output signal 113a of the delay circuit 24, and the NXOR circuit G6 receives at its inputs the output signal 114 of the inverter 14 and the output signal 115 of the inverter 15. The remaining configuration is the same as that of the embodiment 1 as shown in FIG. 1. The configuration of the semiconductor integrated circuit incorporating the PLL circuit, to which the VCO as shown in FIG. 11 is applied, is the same as that of the embodiment 1 as shown FIG. 2 plus the inputs S0 and S1 of the delay control circuit 25.

Figure 5B:
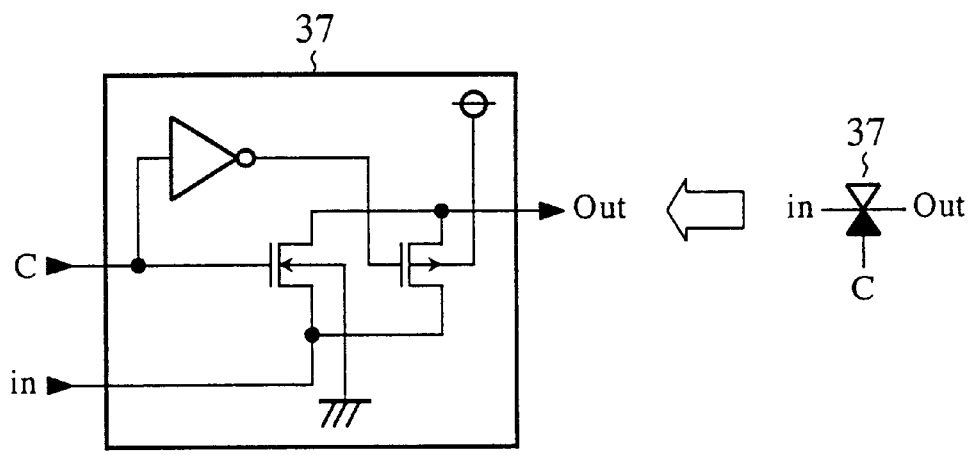

The delay control circuit 25 has the same configuration and the same input and output truth table as those of the delay control circuit 22 as shown in FIGS. 3A and 3B, and the arrangement of the delay circuit 24 is the same as that of the delay circuit 21 as shown in FIG. 4 or FIGS. 5A and 5B. In this embodiment, that of FIGS. 5A and 5B is employed.

Next, the operation of the present embodiment 4 will be described.

Figure 12:
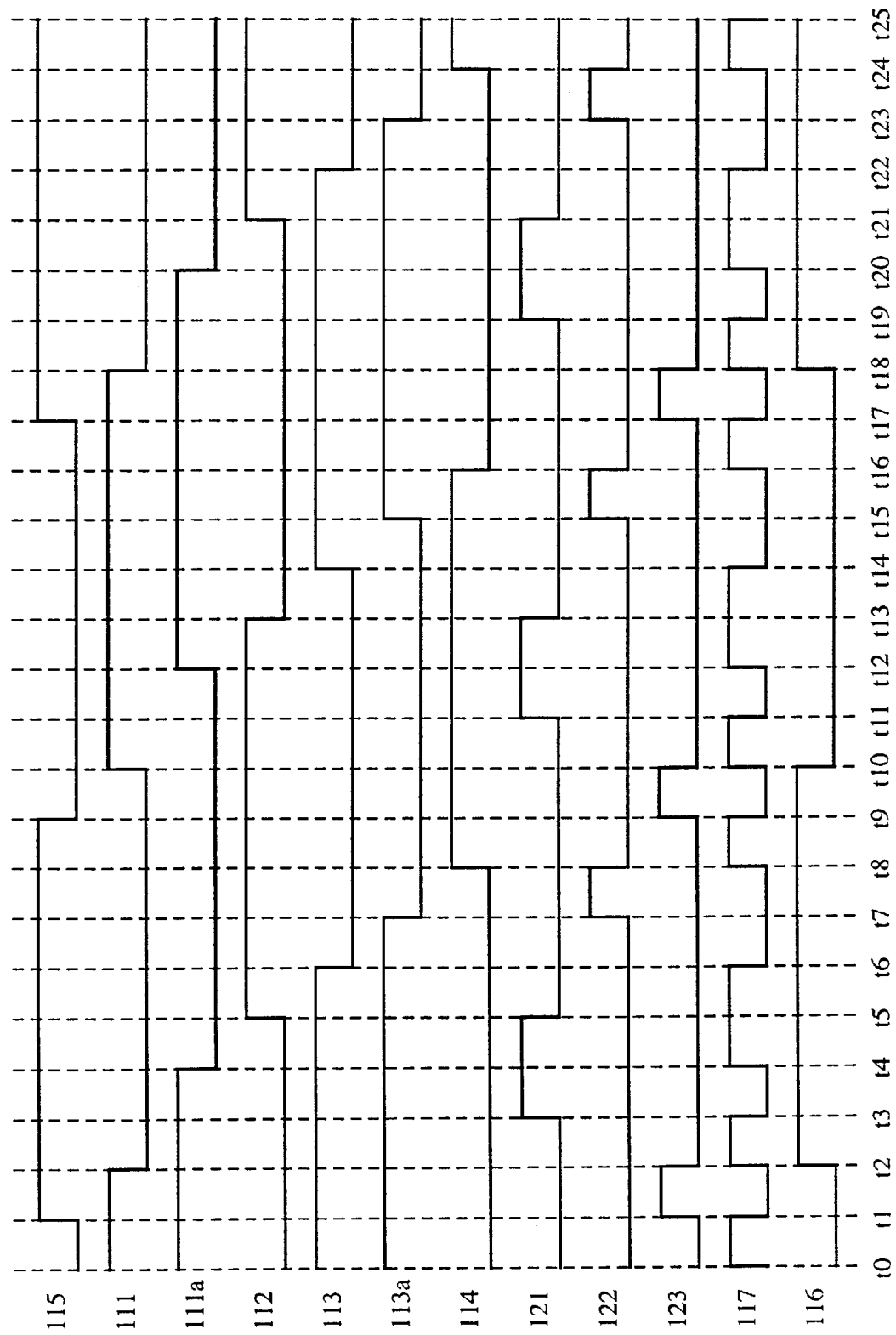
FIG. 12 is a timing chart illustrating outputs of various portions of the VCO in the embodiment 4.
Figure 13:
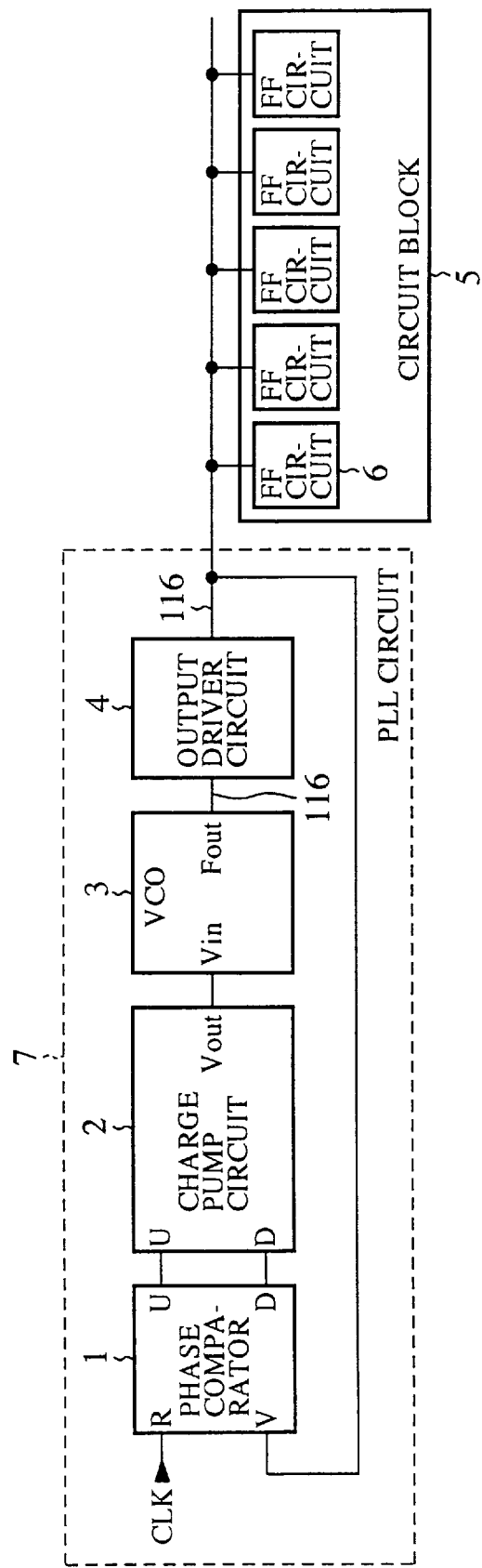
FIG. 13 is a block diagram showing a configuration of a conventional semiconductor integrated circuit including a PLL circuit.

FIG. 12 is a timing chart illustrating outputs of various portions of the VCO 8 in FIG. 11. In FIG. 12, the rising edge of the output signal 115 of the inverter 15 is fed back to the input terminal V of the phase comparator 1 via the output driver circuit 4a of FIG. 2 at times t1 and t17 that define the period at which the PLL circuit 9 locks. The period t1–t17 is equal to the period t1–t15 as illustrated in FIG. 6 in connection with the embodiment 1, and hence Δt=t(n)−t(n−1) is shorter than that of FIG. 6.

In FIG. 11, if "H (high)" signals are supplied to the input terminals S0 and S1 of the delay control circuit 25 in response to the command from the outside of the LSI, the delay control circuit 25 outputs the "H" signal only from the output Y0 in accordance with the truth table of FIG. 3B. This enables the signal 113 supplied to the delay circuit 24 as shown in FIG. 5 to pass through one of the transmission gate 37, and be produced as the output signal 113a, providing it with a delay of Δt because it passes only one element. It is assumed here that the delay time of the delay circuit 21 is 2Δt as in the embodiment 1.

Thus, the output signal 111a of the delay circuit 21 is delayed from the output signal 111 of the inverter 11 by an amount of 2Δt=(t4−t2), the output signal 113a of the delay circuit 24 is delayed from the output signal 113 by an amount of Δt=(t7−t6), and the buffer circuit 19 outputs the first clock signal 116 with the same frequency and the same period as those of the conventional circuit.

In the operational circuit 23, the XOR circuit G4 receives the output signal 111 from the inverter 11 and the output signal 111a from the delay circuit 21, and outputs a signal 121 as shown in FIG. 12; the XOR circuit G5 receives the output signal 113 from the inverter 13 and the output signal 113a from the delay circuit 24, and outputs a signal 122 as shown in FIG. 12; the NXOR circuit G6 receives the output signal 114 from the inverter 14 and the output signal 115 from the inverter 15, and outputs a signal 123 as shown in FIG. 12; and the OR gate G7 receives the signals 121, 122 and 123, and outputs the second clock signal 117, in which case, the outputs of the XOR circuits G4 and G5, NXOR circuit G6 and OR circuit G7 are delayed by Δt from their inputs, respectively.

In this way, the second clock signal 117 output from the operational circuit 23 has a triple frequency and different rise and fall timings as compared with those of the first clock signal 116 output from the buffer circuit 19. As shown in FIG. 2, the first clock signal 116 is supplied to the flip-flop circuit 6a in the circuit block 5a through the output driver circuit 4a, and the second clock signal 117 is supplied to the flip-flop circuit 6b in the circuit block 5b through the output driver circuit 4b. This enables the flip-flop circuit 6a in the circuit block 5a in the LSI to be operated at the same frequency as that of the reference clock signal CLK, and the flip-flop circuit 6b in the circuit block 5b to be operated at the triple frequency, for example.

In addition, changing the delay time of the delay circuits 21 and 24 via the delay control circuits 22 and 25 can vary the duty of the second clock signal 117 as illustrated in FIG. 12 with maintaining its frequency before the change, thereby being able to alter its fall timing.

As described above, the present embodiment 4 has an advantage of being able to prevent the malfunction of the flip-flop circuits 6a and 6b by connecting the delay circuits 21 and 24 across the inverters 11 and 12, and 13 and 14, respectively, by controlling the delay times of the delay circuits 21 and 24 by the commands from the outside via the delay control circuits 22 and 25, and by carrying out with the operational circuit 23 the logical operations between the output signal 111 of the inverter 11 and the output signal 111a of the delay circuit 21, between the output signal 113 of the inverter 13 and the output signal 113a of the delay circuit 24, and between the output signal 114 of the inverter 14 and the output signal 115 of the inverter 15, so as to generate the second clock signal 117 with the triple frequency of the first clock signal 116 output from the buffer circuit 19 for controlling the PLL circuit 9, and to supply, through the output driver circuits 4a and 4b, the flip-flop circuits 6a and 6b in the circuit blocks 5a and 5b with the clock signals whose rise and fall timings differ from each other.

In addition, the present embodiment 4 has another advantage of being able to carry out the fine adjustment of the operation timing of the flip-flop circuit 6b even after the LSI is fabricated because the duty of the second clock signal 117 can be adjusted by controlling the delay times of the delay circuits 21 and 24 through the delay control circuits 22 and 25 in response to the commands from the outside of the LSI.

Although the VCO 8 generates two clock signals in the foregoing embodiments, it can also generate two or more clock signals by further increasing operation circuits and output driver circuits in accordance with the scale of the LSI.

What is claimed is:

1. A PLL circuit including a voltage controlled oscillator that includes an odd number of stages of inverters, said PLL circuit comprising:

a first delay circuit connected between two adjacent inverters of said inverters;

a first delay control circuit for controlling a delay time of said first delay circuit in response to a first delay control circuit external command;

a buffer circuit connected to a last stage of said inverters for producing a first clock signal with a period at which said PLL circuit locks; and an operational circuit for carrying out logic operation between a first input and a second input, and for generating a second clock signal, at least one of a duty and a frequency of said second clock signal being different from that of said first clock signal, said first input being at least one signal selected from among an output signal of said first delay circuit and output signals of said inverters, and said second input being a signal output from said inverters, wherein said signal output from said inverters is also input to said buffer circuit.

2. The PLL circuit as claimed in claim 1, wherein said two adjacent inverters are a first inverter and a second inverter of said inverters, and said operational circuit carries out logical AND operation between the output signal of said first delay circuit and the input signal to said buffer circuit to generate the second clock signal to have a different duty than the first clock signal.

3. The PLL circuit as claimed in claim 1, wherein said two adjacent inverters are a first inverter and a second inverter of said inverters, and said operational circuit carries out logical OR operation between the output signal of said second inverter and the input signal to said buffer circuit to generate the second clock signal to have a different duty than the first clock signal.

4. The PLL circuit as claimed in claim 1, wherein said two adjacent inverters are a first inverter and a second inverter of said inverters, and said operational circuit carries out logical exclusive OR operation between the output signal of said second inverter and the input signal to said buffer circuit to generate the second clock signal to have a different frequency than the first clock signal.

5. The PLL circuit as claimed in claim 1, further comprising:

a second delay circuit connected between another two adjacent inverters of said inverters; and a second delay control circuit for controlling a delay time of said second delay circuit in response to a second delay control circuit external command;

wherein said operational circuit receives one or more output signals of said inverters, output signals of said first delay circuit and said second delay circuit, and the input signal to said buffer circuit, carries out logical operations between them, and generates the second clock signal to have a different frequency than the first clock signal.

6. The PLL circuit as claimed in claim 5, wherein said two adjacent inverters are a first inverter and a second inverter of said inverters, said another two adjacent inverters are a third inverter and a fourth inverter of said inverters, and wherein said operational circuit carries out exclusive OR operation between the output signal of said first inverter and the output signal of said first delay circuit, carries out exclusive OR operation between an output signal of said third inverter and the output of said second delay circuit, carries out equivalence operation between an output signal of said fourth inverter and the input signal to said buffer circuit, and carries out logical OR operation of outputs of the exclusive OR operations and an output of the equivalence operation.

7. The PLL circuit as claimed in claim 1, wherein said logic operation is an AND operation.

8. The PLL circuit as claimed in claim 1, wherein said logic operation is an OR operation.

9. The PLL circuit as claimed in claim 1, wherein said logic operation is an XOR operation.

10. A semiconductor integrated circuit comprising a PLL circuit, said semiconductor integrated circuit comprising:
   a first circuit block including flip-flop circuits to which first data is supplied;
   a second circuit block including flip-flop circuits to which second data is supplied; and
   a PLL circuit including a voltage controlled oscillator that includes an odd number of stages of inverters, wherein said PLL circuit comprises:
      a first delay circuit connected between two adjacent inverters of said inverters;
      a first delay control circuit for controlling a delay time of said first delay circuit in response to a first delay control circuit external command;
      a buffer circuit connected to a last stage of said inverters for producing a first clock signal with a period at which said PLL circuit locks; and
      an operational circuit for carrying out logic operation between a first input and a second input, and for generating a second clock signal, at least one of a duty and a frequency of said second clock signal being different from that of said first clock signal, said first input being at least one signal selected from among an output signal of said first delay circuit and output signals of said inverters, and said second input being a signal output from said inverters, wherein said signal output from said inverters is also input to said buffer circuit;
      a first driver circuit connected to the flip-flop circuits in said first circuit block, wherein said first driver circuit provides said flip-flop circuits in said first circuit block with the first clock signal output from said buffer circuit; and
      a second driver circuit connected to the flip-flop circuits in said second circuit block, wherein said second driver circuit provides said flip-flop circuits in said second circuit block with the second clock signal output from said operational circuit.

11. The semiconductor integrated circuit incorporating a PLL circuit as claimed in claim 7, wherein said PLL circuit further comprises:
   a second delay circuit connected between another two adjacent inverters of said inverters; and
   a second delay control circuit for controlling a delay time of said second delay circuit in response to a second delay control circuit external command; and
   wherein said operational circuit receives one or more output signals of said inverters, output signals of said first delay circuit and said second delay circuit, and the input signal to said buffer circuit, carries out logical operations between them, and generates the second clock signal to have a different frequency than the first clock signal.

12. A PLL circuit including a voltage controlled oscillator that includes an odd number of stages of inverters, said PLL circuit comprising:
   a first delay circuit connected between two adjacent inverters of said inverters;
   a first delay control circuit for controlling a delay time of said first delay circuit in response to a first delay control circuit external command;
   a buffer circuit connected to a last stage of said inverters for producing a first clock signal having a period; and
   an operational circuit for carrying out logic operation between a first input and a second input, and for generating a second clock signal, at least one of a duty and a frequency of said second clock signal being different from that of said first clock signal, said first input being at least one signal selected from among an output signal of said first delay circuit and output signals of said inverters, and said second input being a signal output from said inverters, wherein said signal output from said inverters is also input to said buffer circuit.

* * * * *